United States Patent [19]
Armacost et al.

[11] Patent Number: 6,090,722
[45] Date of Patent: Jul. 18, 2000

[54] PROCESS FOR FABRICATING A SEMICONDUCTOR STRUCTURE HAVING A SELF-ALIGNED SPACER

[75] Inventors: Michael Armacost, Wallkill; Sandra G. Malhotra; Tina Wagner, both of Newburgh; Richard Wise, Beacon, all of N.Y.

[73] Assignee: International Business Machines Corporation, Armonk, N.Y.

[21] Appl. No.: 09/225,595

[22] Filed: Jan. 6, 1999

[51] Int. Cl.[7] .................................................. H01L 21/469
[52] U.S. Cl. ........................ 438/763; 438/705; 438/640; 438/249; 438/568
[58] Field of Search .................................... 438/705, 696, 438/701, 639, 640, 713, 924, 763, 568, 569, 249

[56] References Cited

U.S. PATENT DOCUMENTS

| | | | |
|---|---|---|---|
| 4,575,921 | 3/1986 | Bhagat | 29/571 |
| 5,324,990 | 6/1994 | Cunningham | 307/125 |
| 5,492,793 | 2/1996 | Breyta et al. | 430/270.14 |
| 5,554,485 | 9/1996 | Dichiara et al. | 430/271.1 |
| 5,585,220 | 12/1996 | Breyta et al. | 430/270.1 |
| 5,626,716 | 5/1997 | Bosch et al. | 438/723 |
| 5,915,198 | 6/1999 | Ko et al. | 438/592 |
| 5,926,730 | 7/1999 | Hu et al. | 438/592 |
| 5,937,301 | 8/1999 | Gardner et al. | 438/303 |
| 5,948,701 | 9/1999 | Chooi et al. | 438/694 |
| 5,960,302 | 9/1999 | Ma et al. | 438/585 |

*Primary Examiner*—Matthew Smith
*Assistant Examiner*—Renzo N. Rocchegiani
*Attorney, Agent, or Firm*—Pollock, Vande Sande & Amernick; Joseph P. Abate

[57] ABSTRACT

A self-aligned dielectric spacer is etched by providing capped gate structure along a second layer of dielectric material located above the gate cap material. Dopant material at an increased doping level is provided in the second layer of dielectric material where the self-aligned spacer is to be located. The second layer of dielectric material is then etched selective to the dopant to define the self-aligned dielectric spacer.

19 Claims, 6 Drawing Sheets

PROCESS FOR FABRICATING A SEMICONDUCTOR STRUCTURE HAVING A SELF-ALIGNED SPACER

TECHNICAL FIELD

The present invention relates to a process for fabricating a semi-conductor structure having a self-aligned dielectric spacer structure. More particularly, the present invention is concerned with fabricating a semi-conductor structure having a capped gate structure along with a self-aligned dielectric spacer.

BACKGROUND OF INVENTION

In the formation of semiconductor devices, it is necessary to provide both desired electrical contact between certain regions of the devices formed and also to prevent contact between various other regions of the devices formed on the substrate. One technique for accomplishing this has been by using photoresist and masking techniques whereby those areas to be exposed for electrical contact are patterned in the photoresist and then by developing the patterned photoresist, to thereby expose the desired underlying regions. This technique normally requires several successive masks to perform the entire process, and in its performance each succeeding mask must be precisely aligned. However, as the technology advances, allowing for formation of smaller and smaller devices, it is increasingly difficult to maintain precise overlay tolerance, with the result that even small misalignments of the masks will result in the exposure of small portions of regions that are intended to remain covered. Hence, electrical connections, e.g. by an overlay deposition of a electrically conductive material such as a metal, will connect not only the desired locations, but also those exposed portions of the undesired locations.

Figure 1:
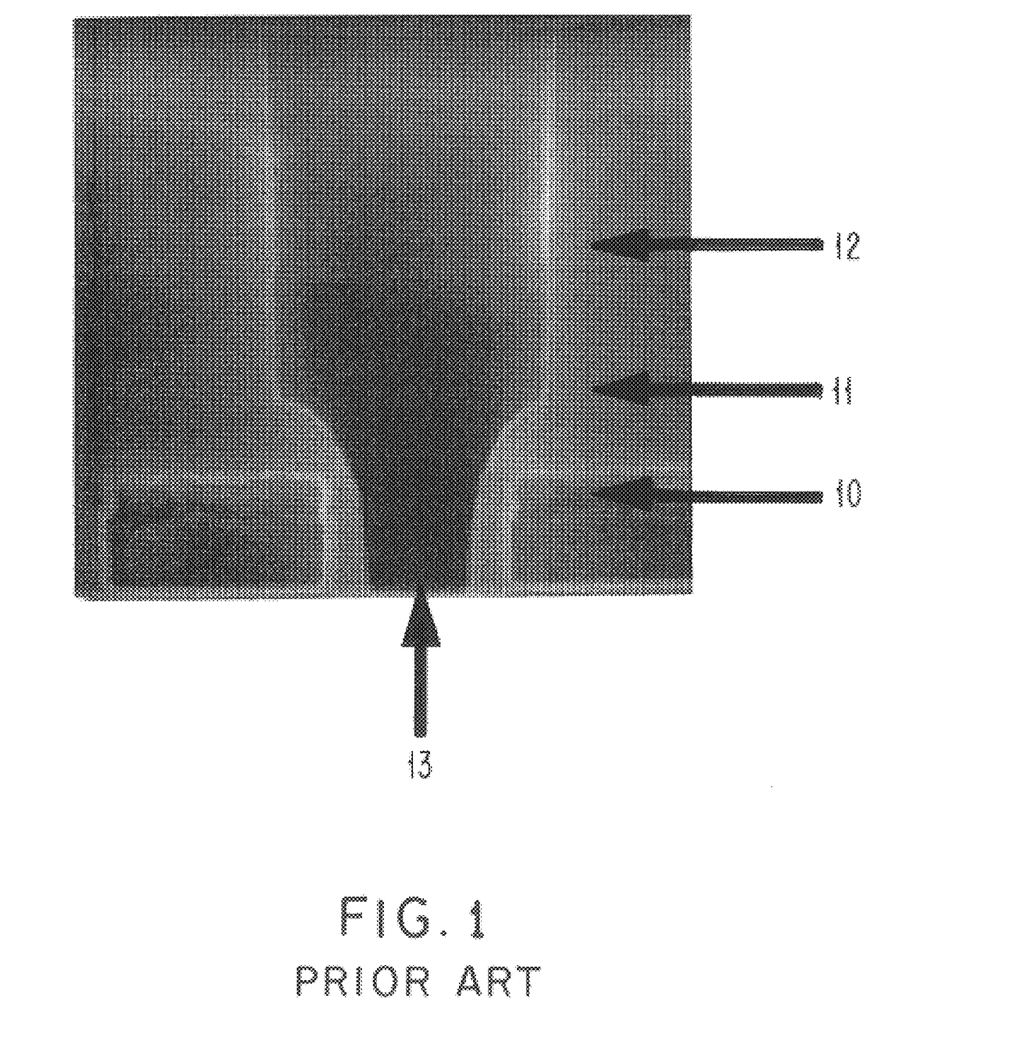
FIG. 1 illustrates a typical prior art self-aligned gate contact stricture.

Accordingly, in order to achieve decreased cell size along with the number of alignment levels in semiconductor devices, self-aligned contact etching has been widely employed. For instance, many etch applications require using a self-aligned feature to minimize mask levels and cell size as illustrated in FIG. 1. For instance, as illustrated in FIG. 1, the gate 10 is protected or capped by a dielectric layer 11 which is typically a silicon nitride. Above layer 11 is a second, chemically different dielectric material 12 such as a silicon oxide. During the etching process to provide the subsequent contact 13 to the underlying semiconductor substrate (not shown) the corner of the dielectric capping is exposed to the etching process. However, in such a process, selectivity to the corner of the underlying material is essential.

Figure 2:
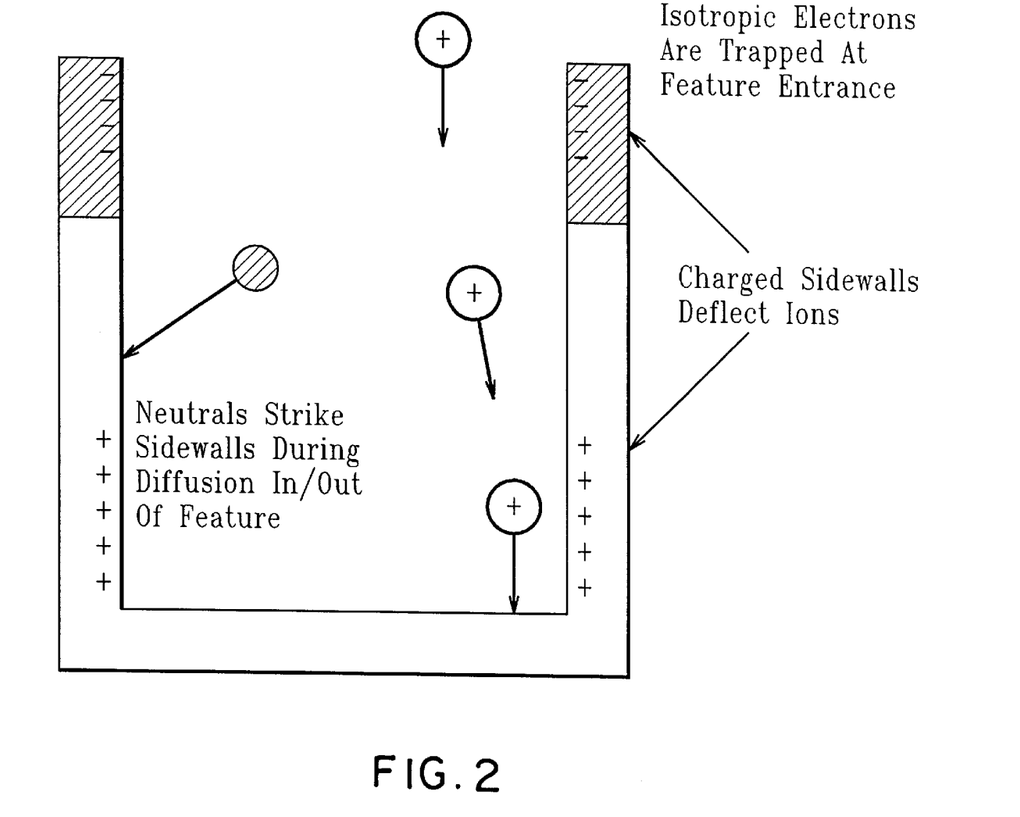
FIG. 2 represents a diagrammatic representation of the charging effects and ion deflection in a high aspect ratio dielectric feature.

In dry etch processes such as high density plasma, achieving this selectivity is often quite difficult due to high ion flux. This is especially pronounced in high aspect ratio features as schematically shown in FIG. 2. Plasma electrons, being highly mobile, are primarily thermal in nature and therefore tend to migrate to the surface of an etched feature. In contrast, positive plasma ions are driven primarily drift through the plasma sheath, and are highly anisotropic. Since the time integrated current to the semiconductor substrate or wafer over one RF cycle must be zero, a net surface charge on dielectric materials can be induced. The shallow entrance of the feature charges negatively as most electrons are captured there, and the deeper features charge positive since positive ions are nearly as likely to reach the bottom of the feature as they are the top. This top to bottom negative potential results in a curvature of positive ions towards the corners of the etched front, and causes the difficulty in achieving selectivity of the self-aligned feature corner.

As device dimensions are reduced, the aspect ratio of the self-aligned contact etch becomes more severe. This further worsens the degree of charging observed, and consequent further corner erosion. New approaches are therefore required to provide self-alignment to underlying features.

Presently, the process for forming self-aligned contact includes a relatively thick nitride cap and spacer to compensate for the loss of selectivity on the feature corner. However, the corner selectivity achieved with the etching process, combined with the thick nitride is marginal for self-aligned contact technology. Moreover, currently the etching processes must observe a relatively narrow process window, due to the excessive polymerization level necessary to achieve corner selectivity.

SUMMARY OF INVENTION

The present invention overcomes problems encountered in the prior art and relates to a process for forming a self-aligned or self-induced spacer. More particular, according to the present invention, a layer containing elevated doping levels is placed within the dielectric at a location where the self-aligned spacer is desired. Below this level, the etched feature "necks off" thereby creating the self-aligned spacer.

Figure 3A:
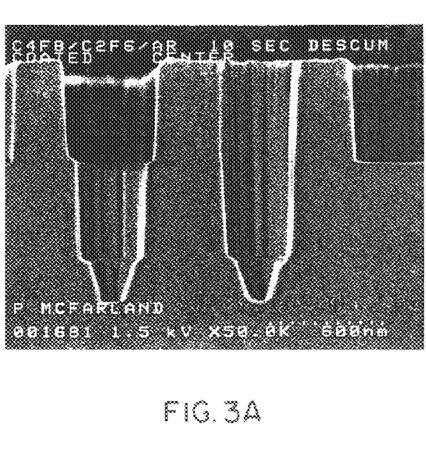
FIGS. 3A and 3B are SEMS of a self induced spacer created according to the process of the present invention.
Figure 3B:
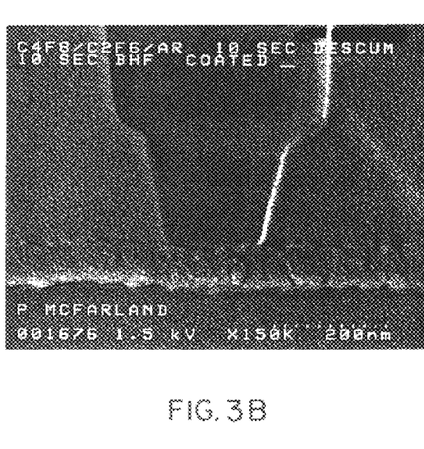
Figure 4:
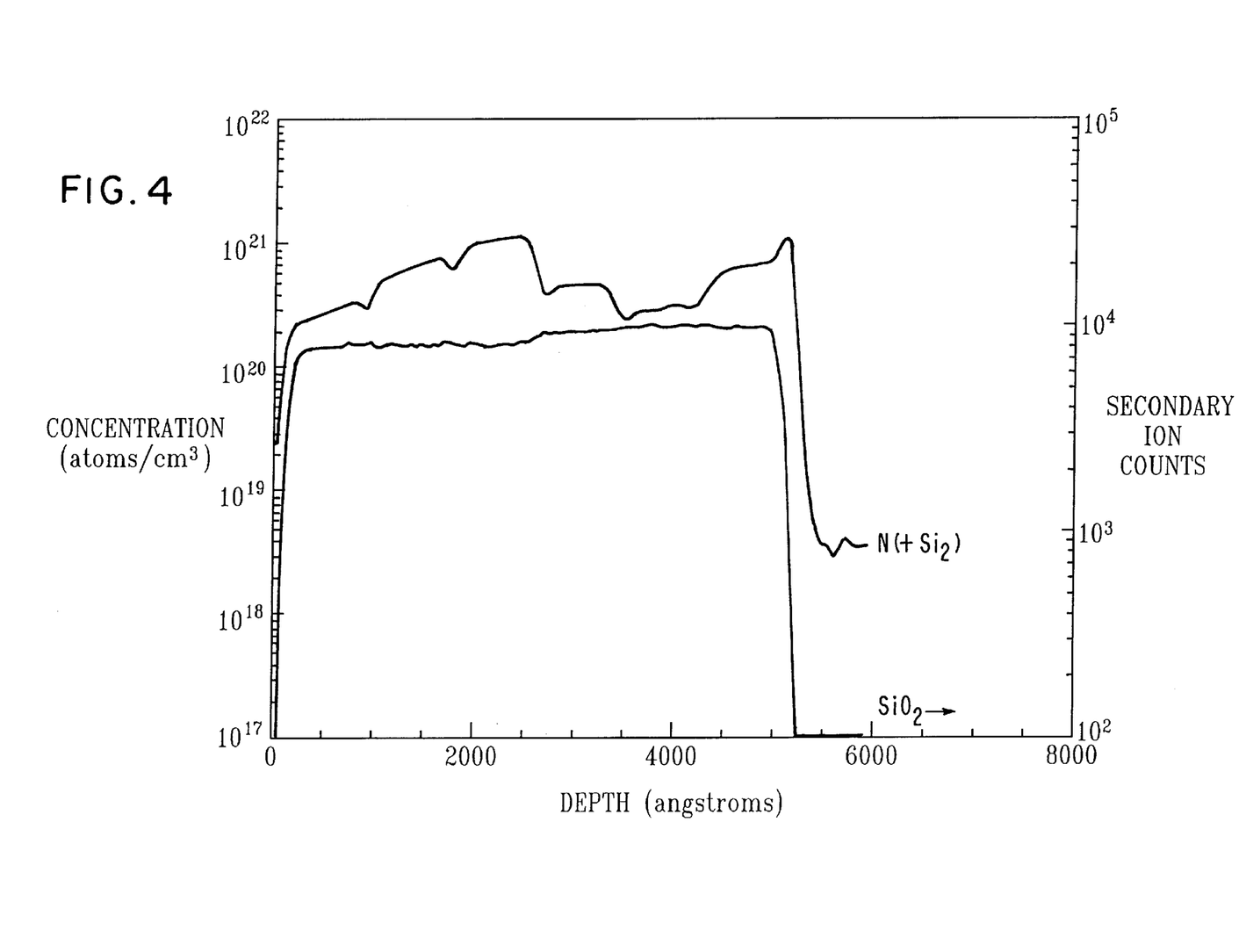
FIG. 4 illustrates SIMS profiling of N dopant in a $SiO_2$ dielectric material.

The present invention is concerned with the process for fabricating a semiconductor structure having a self-aligned dielectric spacer structure. The process comprises providing a semiconductor substrate and providing and defining electrically conductive gate structure on the semiconductor substrate. A first layer of dielectric gate cap material is provided and defined above the gate structure. A second layer of dielectric material located above the first layer of dielectric gate cap material is provided. Dopant material is provided at an increased doping level at a location in the second layer of dielectric material where the self-aligned dielectric spacer is to be located. In dielectric etching, selectivity to underlayers is typically achieved by selective deposition of a polymer there. By utilizing a selective (to the dopant) etch process, the level of polymer deposition is increased when the etch front reaches the heavily doped region. This polymer charges preferentially at the edges of the feature (FIG. 2). This buildup of charge results in "focusing" of the ion flux further in towards the center of the feature, in effect increasing the flux there (due to the decreased cross-sectional area). By tuning the rate of deposition with the incoming ion flux, this focusing effect will allow the etch to proceed only in the center of the etched feature, yielding self-induced shoulder structures as illustrated in FIGS. 3A and 3B.

The present invention also relates to the semiconductor structure obtained by the above defined process.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES OF CARRYING OUT INVENTION

In order to facilitate an understanding of the present invention, reference will be made to the figures.

Figure 5:
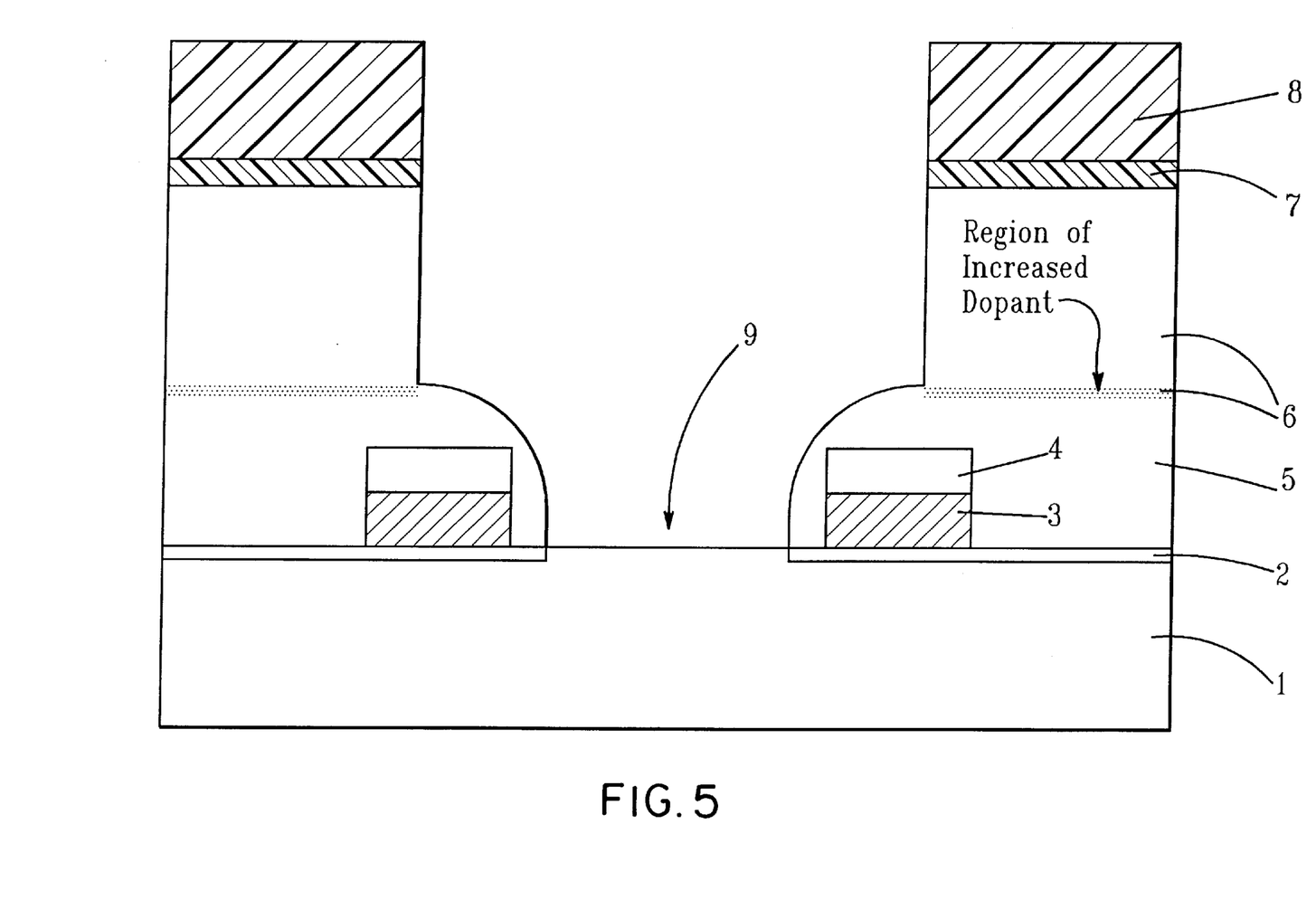
FIG. 5 is a schematic diagram of a self-aligned spacer configuration obtained according to the present invention.

In particular, see FIG. 5 where according to the present invention an insulating gate layer 2 is provided on a semiconductor substrate 1. The semiconductor substrate 1 is typically silicon but can be any other semiconductor material such as Group III–V semiconductor. The insulating layer 2 can be grown on the substrate or can be provided by deposition techniques such as chemical vapor deposition (CVD) or physical vapor deposition (PVD). Also, the insulating layer 2 can be provided by thermal oxidation of the substrate to provide a silicon dioxide. Typically, this layer is about 20 Å to about 350 Å thick and more typically about 30 Å to about 100 Å thick and upon delineation acts as a gate insulator as shown.

A conductive material 3 such as a doped polycrystalline silicon layer is provided on the insulating layer 2. The conducting layer 3 can form gate electrodes on the semiconductor devices which are to be formed on the semiconductor substrate. Typically, the conductive layer 3 is about 500 to about 4000 Å thick and more typically about 1500 to about 3000 Å thick.

A first insulating layer 4 is provided on the conductive layer 3. Typically, this layer is about 300 to about 4000 Å thick and more typically about 500 to about 2000 Å thick. This insulating layer 4 can be an oxide which can be formed by oxidation of a deposited tetraethylorthosilicate (TEOS), followed by heating to temperatures of about 400° C. to about 750° C. to form the oxide or more commonly by CVD deposition. This layer can also be comprised of other dielectric materials, such as silicon nitride ($Si_3N_4$). The layers can be defined by conventional photolithographic techniques such as by applying a photosensitive resist material (not shown) and then patterning it to provide the desired gate structure having a dielectric cap as shown.

After defining the gate structure, the photoresist remaining is removed by for instance dissolving in a suitable solvent.

Next, a second layer of dielectric material 5 is provided such as by oxidation of a deposited tetraethylorthosilicate, followed by heating to temperatures of about 400° C. to about 750° C. to form the oxide. In addition, during formation of the oxide, a dopant 6 such as nitrogen is provided at an increased level at locations where the self-induced spacer is to be subsequently formed. The amount of nitride is typically about 0.5% to about 10% of the layer and more typically about 1 to about 2%. The dielectric layer can be deposited in a plasma enhanced deposition of silicon dioxide. In one particular technique a deposition tool that divides the total deposited thicknesses between five stations is employed, and the films deposited inherently include nitrogen containing layers between the films from each station. This is illustrated in the SIMS profiling of N dopant in a $SiO_2$ dielectric material shown in FIG. 5. However, any manner of depositing the dielectric and introducing the nitrogen can be employed.

The position of the increased nitrogen dopant levels is selected to coincide with the desired position of where the self-imposed spacer is to be delineated. The positioning of the spacer formation is controlled by the depth of the final nitrogen containing interface in conjunction with the etching chemistry.

According to the present invention the dielectric is then coated with an anti-reflective coating 7 such as an organic anti-reflective coating which includes aromatic polysulfones and polyurea polymers. Other anti-reflective coatings include those disclosed in U.S. Pat. No. 5,324,990 to Flaim et al and U.S. Pat. No. 5,554,485, the entire disclosure of which are incorporated herein by reference.

A typical example of an anti-reflective coating composition is referred to as BARL. It includes a poly (arylether) polymer, particularly poly (bis-phenol-a) ether sulfone. A further description of BARL can be found in U.S. Pat. No. 5,554,485. A typical solvent is cyclohexanoe.

The thickness of the anti-reflective coating 7 is typically about 500 Å up to about 2000 Å thick and more typically from about 500 Å to about 1000 Å thick.

After being deposited, the layer of anti-reflective coating 7 may be subjected to elevated temperature such as about 150° C. to about 225° C. in order to cure it.

After depositing the anti-reflective coating 7, a layer of photoresist 8 may be deposited onto the layer of anti-reflective coating. A wide variety of photoresist materials can be employed.

A typical photoresist is UVIIHS which is a radiation sensitive photoresist composition comprising (a) a photosensitive acid generator and (b) a polymer comprising the reaction product of hydroxystyrene with acrylate or methacrylate. A typical example of the photosensitive acid generator is onium salt such as di-t-butylphenyliodonium sulfonate which is further described in U.S. Pat. No. 5,585,220, the entire disclosure of which is incorporated herein by reference. The polymers are further described in U.S. Pat. No. 5,492,793, the entire disclosure of which is incorporated herein by reference. A typical coating solvent for such photoresist is ethyl lactate.

The photoresist 8 may be applied according to methods known to those skilled in the art. The thickness of the photoresist layer may vary, depending upon the application. Typically, the photoresist layer may be from about 0.5 to about 1.4 microns thick, and more typically about 0.6 to about 0.8 microns thick.

After the photoresist 8 is applied over the top of the anti-reflective coating, the photoresist is selectively imagewise exposed to a radiation source to provide the desired pattern in the photoresist.

The pattern in the photoresist 8 typically is formed by placing a mask over the photoresist. The mask is opaque to the wavelengths of radiation used. Such masks are commonly known to those skilled in the art. Other methods for selectively exposing the photoresist to radiation may also be used.

Next, the photoresist 8 may be developed. In developing the photoresist, depending on whether positive or negative photoresist is used, either the exposed or the unexposed portion of photoresist will be removed. Any known processes may be used to remove the desired portions of the photoresist to provide the desired pattern.

After the selected portions of the photoresist are removed, the underlying portions of the anti-reflective coatings are then exposed. The desired portions of the anti-reflective coating can be removed by a plasma etching such as disclosed in U.S. patent application Ser. No. 09/037,497, the entire disclosure of which is incorporated herein by reference.

A typical process employs a flow rate of $C_2F_6$ of about standard cubit centimeters, about 100 standard cubic centimeters per minute of an inert gas such as argon, an inductive power of about 1200 watts, a biased power of about 600 watts, and the pressure in the chamber of about 10 millitorr.

After developing the anti-reflective coating, the dielectric layer 5 is etched and particularly is subjected to a high density plasma etch. During the etching and due to the chemistry of the etchant, a polymer is created at the location of the enhanced dopant level thereby resulting in the self-aligned or self-imposed profile 9. Since higher concentrations of the nitrogen will form preferentially at the corners, the necking down as illustrated is achieved.

More particularly, the etching process is a high density plasma etch employing an etchant gas comprising a mixture of a gaseous fluorocarbon and an inert gas. The amount of fluorocarbon is sufficient to provide the desired etching. The fluorocarbon can be represented by the formula $C_xF_y$ where x is typically an integer of 1 to 4 and y is typically an integer of 4 to 10.

Particular examples of suitable fluorocarbon gases include $CF_4$, $C_2F_6$, $C_3F_8$ and $C_4F_8$. Typical inert gases employed are He, Ar and Xe with Ar being preferred. The preferred amount of fluorocarbon gas is typically a mixture of 0 to 40% of $C_4F_8$ and 0 to 30% of $C_2F_6$ with the amount of the mixture ($C_4F_8+C_2F_6$) being at least about 5 to about 40% of the inert gas. The flow rate of the inert gas is typically from about 50 to 150 standard cubic centimeters. The flow rate of the fluorocarbon gases is typically about 5 sccm to about 50 sccm. The pressure in the chamber for the etching is usually about 4 to about 25 millitorr. Typically, the flow rate of the fluorocarbon is about 1 to about 50%, more typically about 5 to about 40%, and preferably about 10 to about 30% of the flow rate of the inert gas.

Figure 6:
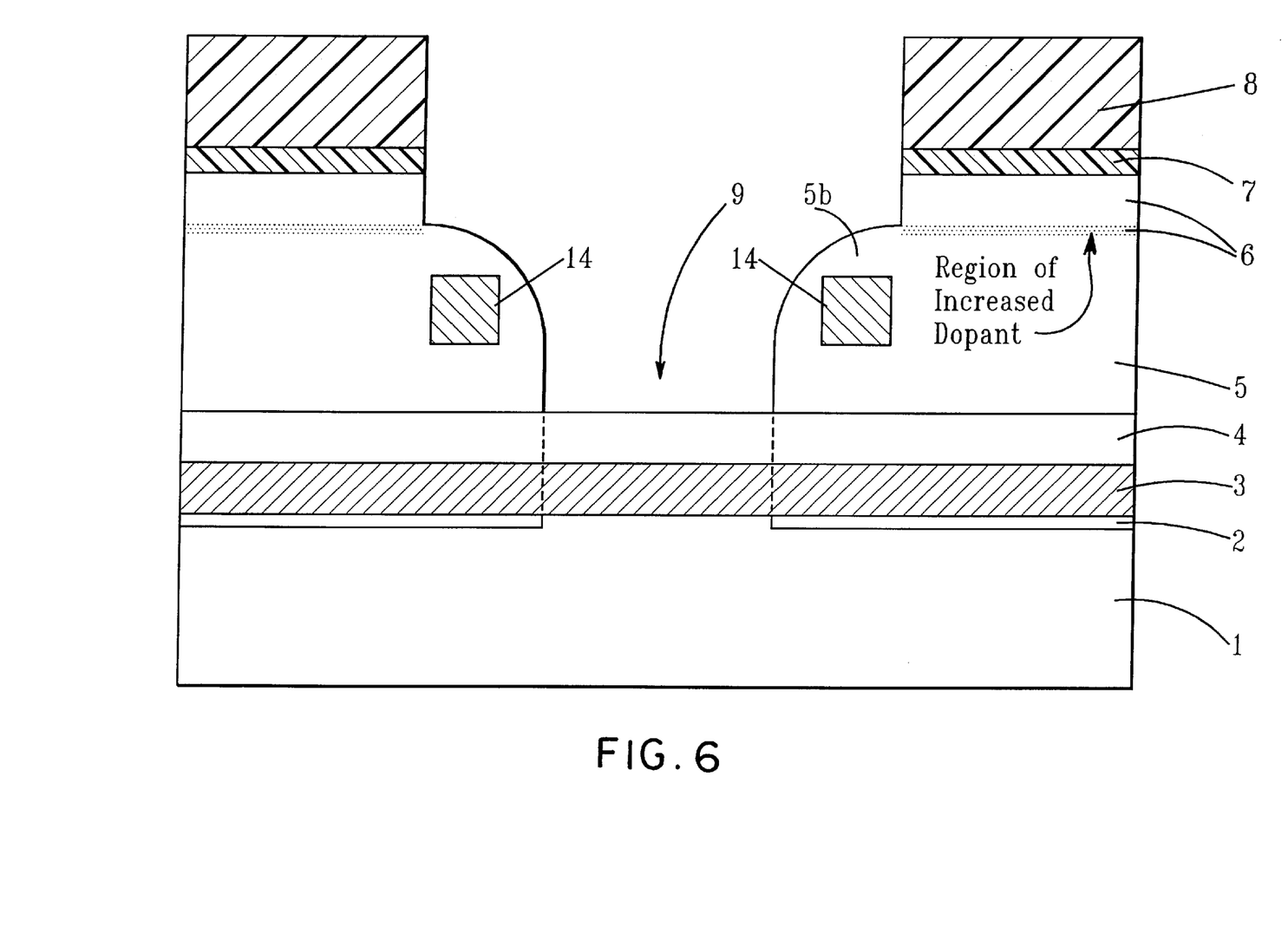
FIG. 6 is a schematic diagram of a structure containing a self-aligned spacer obtained in accordance with the present invention.

FIG. 6 illustrates employing the self-induced spacer according to the present invention for a dual self-aligned contact etch. In particular, a gate insulating layer 2 is provided on a semiconductor substrate 1. The semiconductor substrate 1 is typically silicon but can be any other semiconductor material such as Group III–V semiconductor. The insulating layer 2 can be grown on the substrate or can be provided by deposition techniques such as chemical vapor deposition (CVD) or physical vapor deposition (PVD). Also, the insulating layer 2 can be provided by thermal oxidation of the substrate to provide a silicon dioxide. Typically, this layer is about 20 angstroms to about 350 angstroms thick and more typically about 30 angstroms to about 100 angstroms thick and upon delineation acts as a gate insulator as shown.

A conductive material 3 such as a doped polycrystalline silicon layer is provided on the insulating layer 2. The conducting layer 3 can form gate electrodes on the semiconductor devices which are to be formed on the semiconductor substrate. Typically, the conductive layer 3 is about 500 to about 4,000 angstroms thick and more typically about 1,500 angstroms to 3,000 angstroms thick.

A first insulating layer 4 is provided on the conductive layer 3. Typically, this layer is about 300 to about 4000 angstroms thick and more typically about 500 angstroms to about 2000 angstroms thick. This insulating layer 6 can be an oxide which can be formed by oxidation of a deposited tetraethylorthosilicate (TEOS), followed by heating to temperatures of about 400° C. to about 750° C. to form the oxide or commonly by CVD deposition. This layer can also be comprised of other dielectric materials, such as silicon nitride ($Si_3N_4$). The layers can be defined by conventional photolithographic techniques such as by applying a photosensitive resist material (not shown) and then patterning it to provide the desired gate structure having a dielectric cap as shown.

After defining the gate structure, the photoresist remaining is removed by for instance dissolving in a suitable solvent.

Next, a second layer of dielectric material 5 is provided such as by oxidation of a deposited tetraethylorthosilicate, followed by heating to temperatures of about 400° C. to about 750° C. to form the oxide.

Conductive metallic lines 14 are then deposited and defined by well known techniques.

After this a third layer of dielectric material 5b is deposited on top of dielectric 5 such as by oxidation of a deposited tetraethylorthosilicate, followed by heating to temperatures of about 400° C. to about 750° C. to the oxide. In addition, during formation of the oxide layer 5b, a dopant 6 such as nitrogen is provided at an increased levels at locations where the self-induced spacer is to be subsequently formed. The amount of nitrogen is typically about 0.5% to about 10% of the layer and more typically about 1 to about 2%.

The position of the increased nitrogen dopant levels 6 is selected to coincide with the desired position of where the self-imposed spacer is to be delineated. The positioning of the spacer formation is controlled by the depth of the final nitrogen containing interface in conjunction with the etching chemistry.

According to the present invention the dielectric is then coated with an anti-reflective coating 7 as discussed above. Other anti-reflective coatings include those disclosed in U.S. Pat. No. 5,324,990 to Flaim et al. and U.S. Pat. No. 5,554,485, the entire disclosures of which are incorporated herein by reference.

A typical example of an anti-reflective coating composition is referred to as BARL. It includes a poly (arylether) polymer, particularly poly (bis-phenol-A) ether sulfone.

The thickness of the anti-reflective coating 7 is typically about 500 angstroms up to about 2,000 angstroms thick and more typically from about 500 angstroms to about 1,000 angstroms thick.

After being deposited, the layer of anti-reflective coating 7 may be subjected to elevated temperature such as about 150° C. to about 225° C. in order to cure it.

After depositing the anti-reflective coating 7, a layer of photoresist 8 may be deposited onto of the layer of anti-reflective coating. A wide of variety of photoresist materials as discussed above can be employed.

A typical photoresist is UV II HS which is a radiation sensitive photoresist composition comprising (a) a photosensitive acid generator and (b) a polymer comprising the reaction product of hydroxystyrene with acrylate or methacrylate. A typical example of the photosensitive acid generator is onium salt such as di-t-butylphenyliodonium sulfonate which is further described in U.S. Pat. No. 5,585,220, the entire disclosure of which is incorporated herein by reference. The polymers are further described in U.S. Pat. No. 5,492,793, the entire disclosure of which is incorporated herein by reference. A typical coating solvent for such photoresist is ethyl lactate.

The photoresist 8 may be applied according to methods known to those skilled in the art. The thickness of the photoresist layer may vary, depending upon the application. Typically, the photoresist layer may be from about 0.5 to about 1.4 microns thick, and more typically about 0.6 to about 0.8 microns thick.

After the photoresist 8 is applied over the top of the anti-reflective coating, the photoresist is selectively image wise exposed to a radiation source to provide the desired pattern in the photoresist.

The pattern in the photoresist 8 typically is formed by placing a mask over the photoresist. The mask is opaque to the wavelengths of radiation used. Such masks are commonly known to those skilled in the art. Other methods for selectively exposing the photoresist to radiation may also be used.

Next, the photoresist 8 may be developed. In developing the photoresist, depending on whether positive or negative photoresist is used, either the exposed or the unexposed portion of photoresist will be removed. Any known processes may be used to remove the desired portions of the photoresist to provide the desired pattern.

After the selected portion of the photoresist are removed, the underlying portions of the anti-reflective coatings are then exposed. The desired portions of the anti-reflective coating can be removed by a plasma etching such as disclosed in U.S. patent application Ser. No. 09/037,497, entire disclosure of which being incorporated herein by reference.

A typical process employs a flow rate of $C_2F_6$ of about 10 standard cubic centimeters per minute, about 100 standard cubic centimeters per minute of an inert gas such as argon, an inductive power of about 1,200 watts, a biased power of about 600 watts, and the pressure in the chamber of about 10 millitorr.

After developing the anti-reflective coating, the dielectric layer 5b is etched and particularly is subjected to a high density plasma etch. During the etching and due to the chemistry of the etchant, a polymer is created at the location of the enhanced dopant level thereby resulting in the self-aligned or self-imposed profile 9. Since higher concentrations of the nitrogen will form preferentially at the corners, the necking down as illustrated is achieved.

More particularly, the etching process is a high density plasma etch employing an etchant gas comprising a mixture of a gaseous fluorocarbon and an inert gas. The amount of fluorocarbon is sufficient to provide the desired etching. The fluorocarbon can be represented by the formula $C_xF_y$ wherein X is typically an integer of 1 to 4 and Y is typically an integer of 4 to 10.

Particular examples of suitable fluorocarbon gases includes $CF_4$, $C_2F_6$, $C_3F_8$, and $C_4F_8$. Typical inert gases employed are He, Ar and Xe with Ar being preferred. The preferred amount of fluorocarbon gas is typically a mixture of 0 to 40% of $C_4F_8$ and 0 to 30% of $C_2F_6$ with the amount of the mixture $(C_4F_8+C_2F_6)$ being at least 5 to about 40% of the inert gas. The flow rate of the inert gas is typically from about 50 to 150 standard cubic centimeters per minute. The flow rate of the fluorocarbon gases is typically about 5 sccm to about 50 sccm. Typically, the flow rate of the fluorocarbon is about 1 to about 50%, more typically about 5 to about 40%, and preferably about 10 to about 30% of the flow rate of the inert gas. The pressure in the chamber for the etching is usually about 4 millitorr to about 25 millitorr.

The plasma process employed according t the present invention can be referred to as a reactive ion etching process, whereby the article to be subjected to the etching is placed on a cathode present in the container such as a bell jar. The cathode may be biased, for instance by means of an applied radio frequency signal. According to the present invention, the etch is preferably one that is referred to as a high density plasma etch and carried out in a high density plasma tool such as one available under the trade designation AMAT Omega. Of course,other such tools can be employed. The power supplied to the gas and cathode can be applied by an inductive coupling.

The inductive power is typically less than about 2500 watts and preferably at least about 2000 watts, a typical example being about 1200 watts. The bias power employed is typically less than about 1000 watts and more typically at least about 400 watts, a specific example being about 600 watts.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for forming a self-aligned dielectric spacer which comprises the steps of providing a semiconductor substrate;

providing an electrically conductive gate structure on the semiconductor substrate;

providing a first layer of dielectric gate cap material on the gate structure;

providing a second layer of dielectric material located above the dielectric gate cap material;

providing dopant at an increased doping level at selected locations in the second layer of dielectric material where the self-aligned spacer is to be located; and etching the second layer of dielectric material with an etchant selective to the dopant thereby forming polymer at said selected locations and thereby defining the self-aligned dielectric spacer.

2. The method of claim 1 wherein the electrically conductive gate structure comprises doped polycrystalline silicon.

3. The method of claim 1 wherein the first layer of dielectric gate cap material comprises silicon dioxide.

4. The method of claim 1 wherein the second layer of dielectric material comprises silicon dioxide.

5. The method of claim 1 wherein the dopant comprises nitrogen.

6. The method of claim 5 wherein the amount of the nitrogen is about 0.5% to about 10% of the second layer of dielectric material.

7. The method of claim 5 wherein the amount of the nitrogen is about 1 to about 2% of the second layer of dielectric material.

8. The method of claim 1 wherein the etching is reactive in etching which comprises:

provinding the structure to be etched in a processing chamber;

introducing an etchant gas into said container wherein said etchant gas comprises a mixture of gaseous fluorocarbon and an inert gas wherein the amount of said fluorocarbon is sufficient to provide etching of the second layer of dielectric material selective to the dopant;

creating a plasma in the chamber, thereby etching the second layer of dielectric material and defining the self-aligned dielectric spacer.

9. The method of claim 8 wherein said plasma is a high density plasma.

10. The method of claim 8 wherein the flow rate of the inert gas is about 50 to about 150 sccm.

11. The method of claim 8 wherein the flow rate of the fluorocarbon is about 1 to about 50% of the flow rate of the inert gas.

12. The method of claim 8 wherein the flow rate of the fluorocarbon is about 10 to about 30% of the flow rate of the inert gas and the flow rate of the inert gas is about 50 to about 150 sccm.

13. The method of claim 8 wherein the fluorocarbon is selected from the group consisting of $CF_4$, $C_2F_6$, $C_3F_8$ and $C_4F_8$ and wherein the inert gas is selected from the group consisting of He, Ar and Xe.

14. The method of claim 8 wherein said fluorocarbon is $C_2F_6$ and said inert gas is argon.

15. The method of claim 8 wherein the pressure in said container during the etching is abut 5 to about 15 millitorr.

16. The method of claim 8 wherein the fluorocarbon is $C_2F_6$ or $C_4F_8$ or both and the flow of said fluorocarbon is about 5 sccm to about 50 sccm, the inert gas is argon, and the flow of the inert gas is about 50 sccm to 150 sccm.

17. The method of claim 8 wherein the pressure in the chamber for etching is about 5 millitorr to about 25 millitorr.

18. The method of claim 1 further comprising providing electrically conductive contact to the semiconductor structure.

19. The method of claim 1 wherein said etching the second layer of dielectric material defines the self-aligned dielectric spacer which necks down below said selected locations.

* * * * *

UNITED STATES PATENT AND TRADEMARK OFFICE
CERTIFICATE OF CORRECTION

PATENT NO. : 6,090,722

DATED : July 18, 2000

INVENTOR(S) : Michael Armacost, et al.

It is certified that error appears in the above-identified patent and that said Letters Patent is hereby corrected as shown below:

```
Col. 5, line 11, after ``about'' insert ---10---.
Col. 8, line 4, change ``t'' to -to--.
```

Signed and Sealed this

Seventeenth Day of April, 2001

Attest:

NICHOLAS P. GODICI

Attesting Officer

Acting Director of the United States Patent and Trademark Office